United States Patent
Anderson et al.

(10) Patent No.: US 8,946,049 B2
(45) Date of Patent: Feb. 3, 2015

(54) REPLACEMENT GATE STRUCTURES AND METHODS OF MANUFACTURING

(75) Inventors: Brent A. Anderson, Jericho, VT (US); Edward J. Nowak, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 316 days.

(21) Appl. No.: 13/444,447

(22) Filed: Apr. 11, 2012

(65) Prior Publication Data

US 2013/0270644 A1    Oct. 17, 2013

(51) Int. Cl.
*H01L 27/088* (2006.01)
*H01L 21/762* (2006.01)

(52) U.S. Cl.
USPC .............. 438/424; 438/587; 257/368

(58) Field of Classification Search
CPC .............. H01L 27/088; H01L 21/823481; H01L 21/823437
USPC .............. 438/424, 587; 257/368, E21.546, 257/E27.06
See application file for complete search history.

(56) References Cited

U.S. PATENT DOCUMENTS

| | | | |
|---|---|---|---|
| 7,731,864 B2 | 6/2010 | Feller et al. | |
| 7,986,012 B2 | 7/2011 | Matsubara et al. | |
| 8,048,790 B2 | 11/2011 | Soss et al. | |
| 8,084,346 B1 | 12/2011 | Guo et al. | |
| 2004/0038535 A1* | 2/2004 | Barns et al. | 438/692 |
| 2010/0044785 A1* | 2/2010 | Murphy et al. | 257/330 |
| 2011/0156107 A1 | 6/2011 | Bohr et al. | |

* cited by examiner

*Primary Examiner* — Walter H Swanson
(74) *Attorney, Agent, or Firm* — Michael LeStrange; Roberts Mlotkowski Safran & Cole, P.C.

(57) ABSTRACT

Gate structures and methods of manufacturing is disclosed. The method includes forming a continuous replacement gate structure within a trench formed in dielectric material. The method further includes segmenting the continuous replacement gate structure into separate replacement gate structures. The method further includes forming insulator material between the separate replacement gate structures.

17 Claims, 4 Drawing Sheets

REPLACEMENT GATE STRUCTURES AND METHODS OF MANUFACTURING

FIELD OF THE INVENTION

The invention relates to semiconductor structures and, more particularly, to gate structures and methods of manufacturing.

BACKGROUND

Moore's law predicts that the number of transistors that can be placed on an integrated circuit (IC) is doubled approximately every two years. However, as the number of transistors increases and their size decreases, smaller physical gate end to end spacing is required. It has been found, though, that smaller physical gate end to end spacing is becoming ever more difficult to achieve. This, in turn, will limit the density and performance achieved by further scaling of devices.

By way of example, at a 32 nm node, it is currently possible to only achieve an approximate 75 nm end to end spacing between adjacent gate structures, i.e., replacement gate structures or hybrid replacement gate structures. Accordingly, physical gate end to end spacing is not scaling well, particularly with the need for multiple exposures and processes to form the gate structures. In fact, replacement gate processes, e.g., exposure, etching and deposition processes, may even contribute to shorting of the gate structures (i.e., end to end touching of the gate material). Accordingly, end to end spacing, going forward, may even degrade device performance.

Accordingly, there exists a need in the art to overcome the deficiencies and limitations described hereinabove.

SUMMARY

In an aspect of the invention, a method comprises forming a continuous replacement gate structure within a trench formed in dielectric material. The method further comprises segmenting the continuous replacement gate structure into separate replacement gate structures. The method further comprises forming insulator material between the separate replacement gate structures.

In an aspect of the invention, a method comprises forming a dummy gate material on a substrate having active regions and isolation regions. The method further comprises patterning the dummy gate material to form a plurality of continuous dummy gate strips, spanning over the active regions and isolation regions. The method further comprises forming dielectric material about the continuous dummy gate strips, and forming a plurality of trenches in the dielectric material by removing the dummy gate strips. The method further comprises forming continuous replacement gate structures within the plurality of trenches. The method further comprises segmenting the continuous replacement gate structures to form a plurality of segmented replacement gates, with an end to end spacing between the plurality of segmented replacement gates. The method further comprises filling the end to end spacing with an insulator material.

In an aspect of the invention, a structure comprises a plurality of replacement gate structures formed over active regions and isolation structures. The structure further comprises a dielectric material in an end to end spacing between adjacent replacement gate structures of the plurality of replacement gate structures. The dielectric material is in direct contact with the adjacent replacement gate structures of the plurality of replacement gate structures.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a gate structure, which comprises the structures of the present invention. In still further embodiments, a method in a computer-aided design system is provided for generating a functional design model of the gate structure. The method comprises generating a functional representation of the structural elements of the gate structure.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

Figure 1:
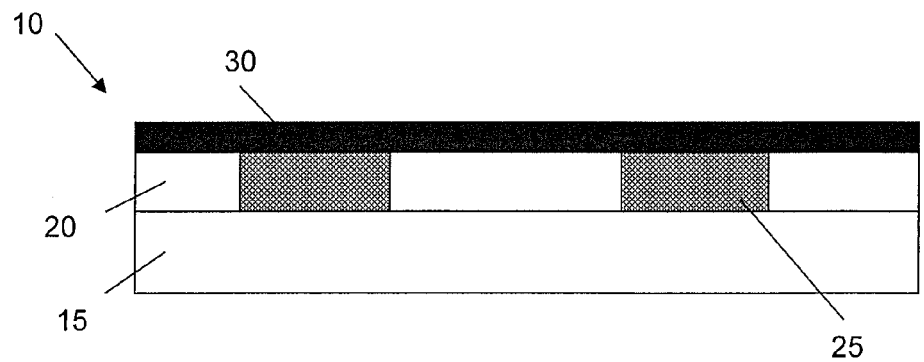
FIGS. 1-8 show fabrication processes and respective structures in accordance with aspects of the present invention.

The invention relates to semiconductor structures and, more particularly, to replacement gate structures and methods of manufacturing. More specifically, the replacement gate structures of the present invention are damascene replacement gate structures (or hybrid replacement gate structures) with a reduced end to end spacing therebetween, compared to conventional replacement gate structures. In embodiments, the end to end spacing can be considerably smaller than conventional replacement gate structures, in that the spacing is formed at back end of gate formation processes.

In particular, in embodiments, a continuous gate material can be formed within a trench, and then cut into segments after exposures, etching and deposition processes are complete, to form multiple (segmented) damascene gate structures with reduced end to end spacing. In embodiments, by implementing a damascene gate cut after the replacement gate flow, the gate end to end spacing can be reduced to approximately 30 nm and less. Also, advantageously, the formation of the spacing is independent of the multiple exposures required for gate formation, and hence can allow for improved lithography, etching and polishing processes, while significantly reducing the end to end spacing of the gate structures. In embodiments, the damascene gate structures can be a replacement metal gate material; although, a poly gate is also contemplated by the present invention.

In embodiments, the processes of forming the gate structures of the present invention can include replacement gate processes or hybrid replacement gate processes. For example, the processes include forming continuous dummy gate structures over active regions and isolation structures. The continuous dummy gate structures can include, for example, a poly material formed directly on the active regions and isolation structures. In optional embodiments, a gate dielectric layer can be formed under the poly material, which can remain during replacement gate flows. The gate dielectric layer can be a high-k material such as hafnium oxide.

A dielectric is then formed around the continuous dummy gate structures, which is then planarized to the top of the continuous dummy gate structures. The continuous dummy gate structures are then removed to form continuous openings (trenches). A replacement metal gate material is then formed in the openings. In embodiments, a dielectric material and liner can also be formed in the trenches, prior to the deposition of a replacement gate material. The replacement gate material will form a continuous replacement gate structure. After the formation of the continuous replacement gate structure, an opening is formed within the continuous replacement gate structure to form separate (segmented) replacement gate structures with a reduced end to end spacing, compared to conventional processing of replacement gate structures. In embodiments, the end to end spacing can be formed by masking and etching processes to cut the continuous replacement gate structure into segments, with a spacing therebetween of about 30 nm or less. In embodiments, the spacing can then be filled with dielectric material and, in optional embodiments, the structure can then be planarized.

In embodiments, the replacement gate structures are in direct contact with the dielectric material, at the end to end spacing. That is, the damascene dielectric material which separates the replacement gate structures are in direct contact with ends of adjacent replacement gate structures. In embodiments, the replacement gate structures can also be formed on a liner material of, for example, TiN, Ta, TaN, TiAl, or other conductive liner. The liner material can be provided on the sidewalls of the replacement gate structures, as well as at a single end of two outermost replacement gate structures. That is, as to the latter feature, only the outer end of two outermost replacement gate structures will have liner material. This is a result of the formation processes which initially includes a single continuous opening, formed by the removal of the continuous dummy gate structure.

More specifically, FIG. 1 shows a structure and respective processing steps in accordance with the present invention. It should be understood by those of ordinary skill in the art that the structure of FIG. 1 is a planar structure; although the present invention will also apply to non-planar transistor structures such as a FINFET. The structure 10 includes a substrate 15. In embodiments, the substrate 15 can be any substrate such as silicon, oxide or other dielectric material. Shallow trench isolation structures 20 are formed between active Si regions 25, using conventional processes. In embodiments, the active Si regions 25 can be part of a silicon on insulation (SOI) substrate, formed using conventional processes, e.g., wafer bonding, SiMOX, etc.

In embodiments, the shallow trench isolation (STI) structures 20 can be formed using conventional lithographic, etching and deposition methods, known to those of skill in the art. For example, a resist layer can be formed over the silicon material, and exposed to energy to form a pattern (openings). A reactive ion etching (RIE) can then be performed to pattern (e.g., form trenches) the underlying silicon material. The resist can then be removed using any conventional oxygen ashing process. An oxide or other insulator material can then be deposited within the trenches. A dummy gate material 30 is then blanket deposited on exposed surfaces of the STI structures 20 and active Si regions 25. In embodiments, the dummy gate material 30 can include a poly material. In embodiments, a gate dielectric material (high-k material) can be provided under the poly material, also represented by reference numeral 30.

Figure 2:
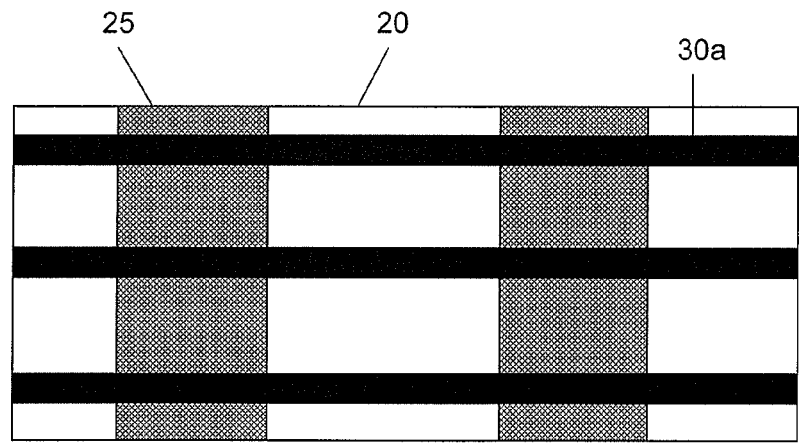

FIG. 2 shows a top view and respective processing steps of an intermediate structure of the present invention. In the processes shown in FIG. 2, the dummy gate material is patterned to form continuous dummy gate structures (strips) 30a. In embodiments, the dummy gate material can be patterned using, for example, conventional lithographic and etching processes, as described above. As shown, the patterning process results in strips of the continuous dummy gate material, with portions of the STI structures 20 and active Si regions 25 being exposed. Also, the patterning of the dummy gate material forms a plurality of continuous dummy gate strips, spanning over the active Si regions 25 and STI structures 20.

Figure 3:
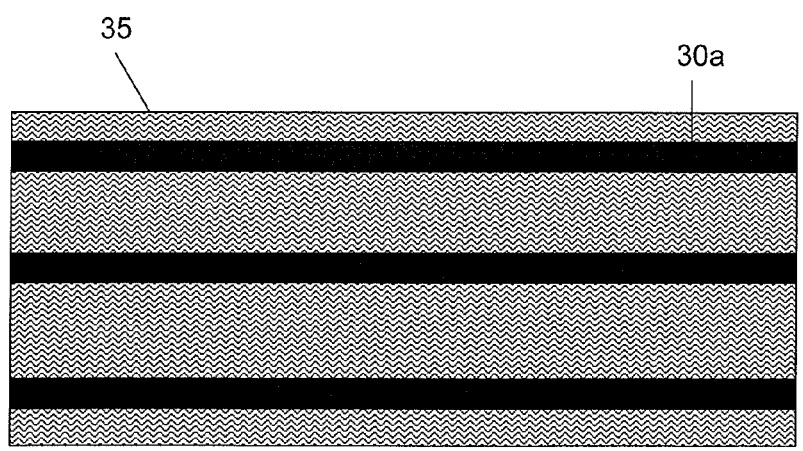

In FIG. 3, dielectric material 35 is formed over the exposed surfaces, e.g., STI structures 20, active Si regions 25 and continuous dummy gate structures 30a. The dielectric material can be, for example, formed by a blanket deposition of oxide using conventional deposition processes, e.g., chemical vapor deposition. The dielectric material 35 is then planarized to expose the top surfaces of the continuous dummy gate structures 30a.

Figure 4:
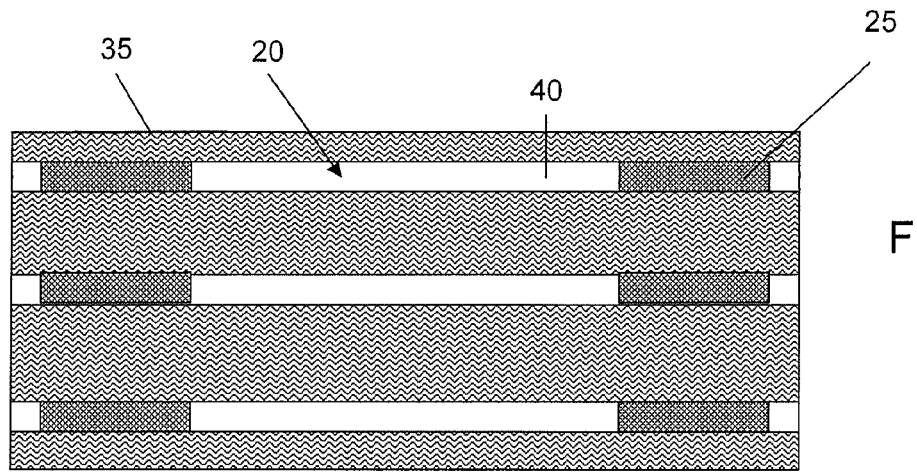

In FIG. 4, the dummy gate material is removed to form a continuous opening (e.g., continuous trench) 40 within the dielectric material 35. In embodiments, gate dielectric material can also be removed; however, in optional processes, the gate dielectric material can also remain within the bottom of the opening 40, to be used as the gate dielectric material for the replacement gate structure. If the gate dielectric material is removed, then portions of the underlying STI structures 20 and active Si regions 25 will be exposed.

Figure 5:
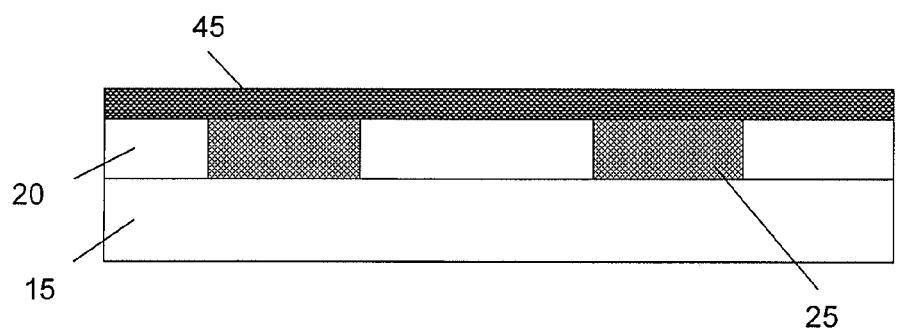
Figure 6:
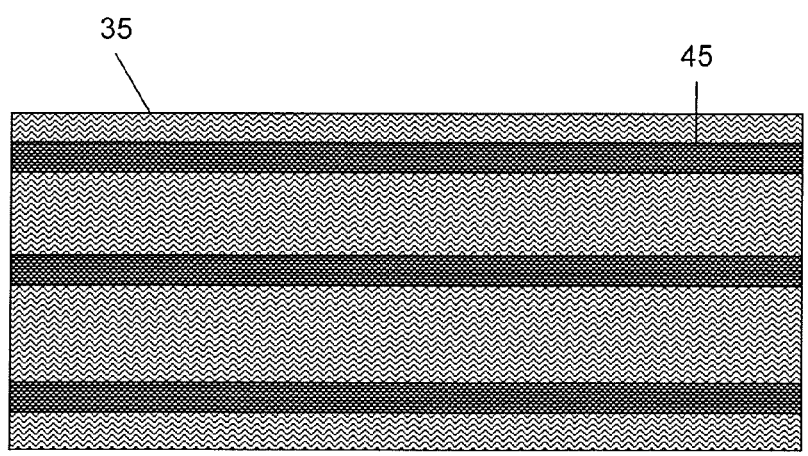

FIGS. 5 and 6 show additional processing steps and respective structure in accordance with the present invention. FIG. 5 shows a cross sectional side view of the structure; whereas, FIG. 6 shows a top view of the structure. More specifically, as shown in both FIGS. 5 and 6, a replacement gate material 45 is formed within the continuous openings 40 of FIG. 4. In embodiments, the replacement gate material 45 can be a metal or combination of metals, depending on the desired work function of the device; although poly material can also be used. In embodiments, a gate dielectric material can also be deposited within the openings, prior to the filling with the replacement gate material 45. The gate dielectric material can also be represented by reference numeral 45. The metal and dielectric material can be deposited using conventional deposition methods including, for example, Atomic Layer Deposition (ALD) for the high-k and metal depositions, or electroplating processes for the metal materials. In optional embodiments, the metal (or other gate material) can be planarized using conventional chemical mechanical polishing (CMP) processes.

Figure 7:
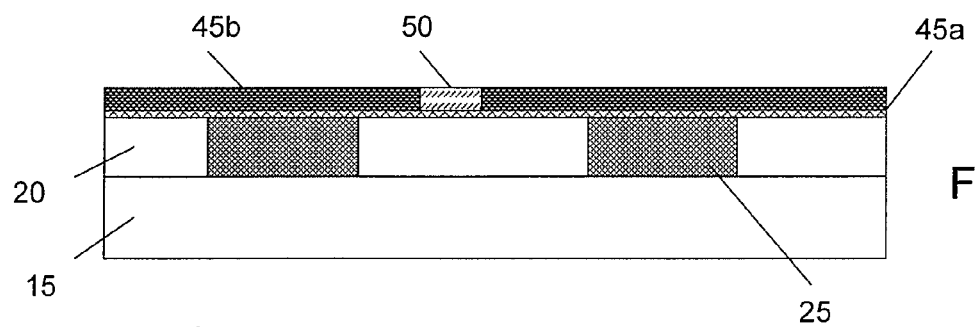
Figure 8:
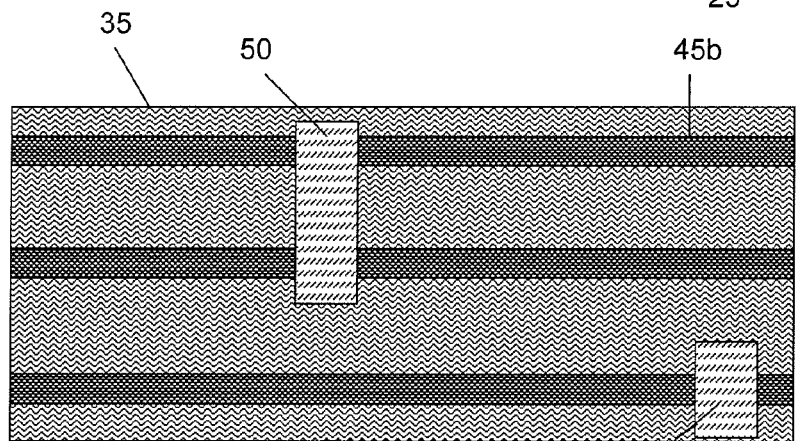

FIGS. 7 and 8 show additional processing steps and respective structure in accordance with the present invention. FIG. 7 shows a cross sectional side view of the structure; whereas, FIG. 8 shows a top view of the structure. FIG. 7 shows the gate dielectric material as reference 45a. The gate dielectric material 45a can be any gate dielectric material such as, for example, a high-k material such as hafnium oxide.

Figure 9:
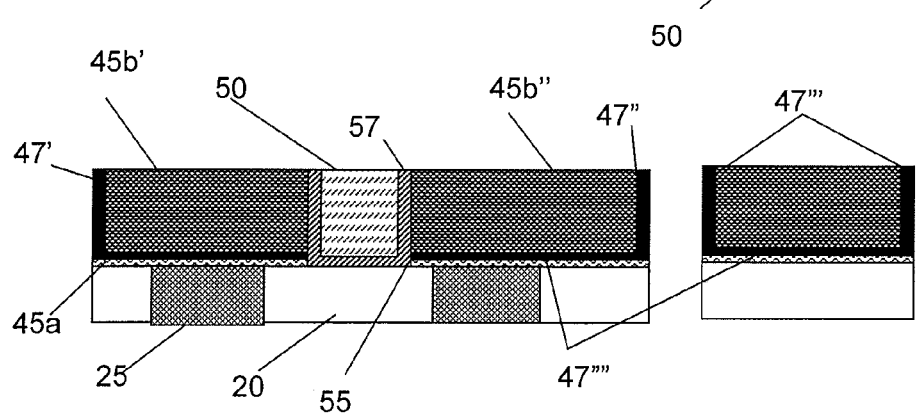
FIG. 9 shows a replacement gate structure and respective fabrication processes in accordance with aspects of the present invention.

As further shown in both FIGS. 7 and 8, the replacement gate material is segmented to form a plurality of replacement gate structures 45b. In embodiments, the gate dielectric material 45a can also be segmented, i.e., cut (as shown in FIG. 9). This segmentation forms an opening that can be filled with insulator material 50, e.g., $SiO_2$, SiCN, SiN or combination of these insulator materials. In optional embodiments, the insulator material 50 can undergo a planarization process, e.g., CMP process.

In embodiments, the opening is formed by conventional masking and etching processes, and the insulator material can be deposited using conventional deposition processes, e.g., CVD. In this way, the replacement gate structures 45b can be formed at an end of the processing flow, with a minimum end to end spacing between the segmented replacement gate structures 45b, e.g., on the order of 30 nm or smaller.

As should be understood by those of skill in the art, the replacement gate structures 45b can be segmented along any desired length, depending on the application of the device and other design criteria. That is, the present invention contemplates different length replacement gate structures 45b as shown in FIG. 8.

FIG. 9 shows an alternative structure and processing steps in accordance with aspects of the present invention. In embodiments, a liner 55 can be formed in the trench, prior to the deposition of the metal replacement gate fill material. The liner 55, as shown in FIG. 9, will be formed along all of the sidewalls of the opening (formed by the removal of the dummy gate material), prior to the deposition of the replacement gate material. The liner 55 can be a conductive metal liner which sets the work function and also can be a barrier to metal migration. In embodiments, there is also an optional liner 57 in the dielectric formed in the opening between gate segments 45b' and 45b". This liner 57 is, in embodiments, SiC—N or SiN, for example. In embodiments, the liner 55 is formed on top of the gate dielectric material, e.g., high-k dielectric material (e.g., hafnium oxide). In other embodiments for a full replacement metal gate process, the liner 55 is formed on the substrate and STI and comprises a high-k dielectric material layer and a conductive metal liner layer.

In the processing flow of FIG. 9, the opening formed between the gate materials can be filled with any dielectric material. The opening is formed by an etching step, extending through the liner 55 and the gate dielectric material 45a. This, in turn, will form two segmented replacement gate structures 45b' and 45b". As shown in FIG. 9, as the liner 55 is formed on the sidewalls of the opening, this liner 55 will not be provided between the two segmented replacement gate structures 45b' and 45b"; instead, the two adjacent ends of the segmented replacement gate structures 45b' and 45b" will be in direct contact with the dielectric material 57. However, the liner 55 will be provided at the opposing ends 47' and 47" of the two end replacement gate structures 45b' and 45b", respectively, in addition to along both the sidewalls 47''' and bottom 47'''' (except at the segmented region, e.g., end to end spacing between the replacement gate structures 45b' and 45b").

Figure 10:
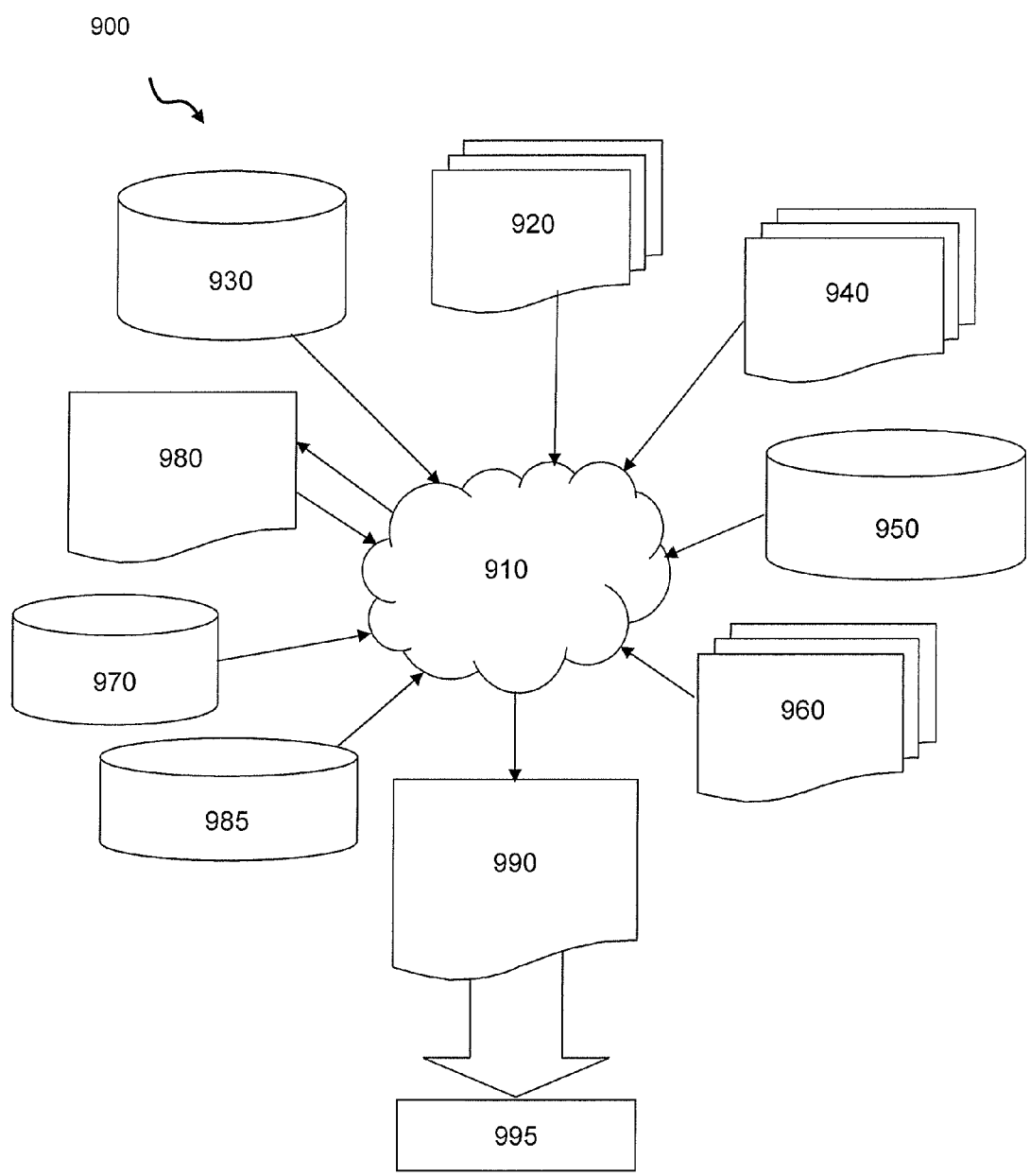
FIG. 10 is a flow diagram of a design process used in semiconductor design, manufacture, and/or test.

FIG. 10 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    forming a continuous replacement gate structure within a trench formed in dielectric material;
    segmenting the continuous replacement gate structure into separate replacement gate structures; and
    forming insulator material between the separate replacement gate structures,
    wherein the forming the continuous replacement gate structure comprises:
        forming a continuous dummy gate structure;
        forming the dielectric material about the continuous dummy gate structure;
        removing the continuous dummy gate structure to form the trench; and
        depositing metal material within the trench.

2. The method of claim 1, wherein the forming the continuous replacement gate structure further comprises forming a gate dielectric in the trench, prior to the depositing.

3. The method of claim 2, wherein the gate dielectric is a high-k dielectric material.

4. The method of claim 1, wherein the forming the continuous dummy gate structure comprises blanket depositing a poly material over a substrate and patterning the poly material to form a continuous strip.

5. The method of claim 4, wherein the substrate comprises shallow trench isolation structures and active silicon regions.

6. The method of claim 1, wherein the insulator material is a deposited $SiO_2$, SiC—N or SiN or a combination of $SiO_2$, SiC—N or SiN.

7. The method of claim 1, further comprising planarizing the insulator material.

8. The method of claim 1, wherein the trench is formed by removing strips of dummy gate material, and a gate dielectric material is formed under the dummy gate material, prior to the removing of the strips.

9. A method, comprising:
    forming a continuous replacement gate structure within a trench formed in dielectric material:
    segmenting the continuous replacement gate structure into separate replacement gate structures; and forming insulator material between the separate replacement gate structures, wherein the insulator material is deposited as a liner, wherein the liner is deposited SiC—N, SiN or $SiO_2$.

10. The method of claim 1, further comprising forming a conductive liner within the trench, wherein the conductive liner is formed over a gate dielectric material, prior to the forming of the continuous replacement gate structure.

11. The method of claim 1, wherein the separate replacement gate structures are formed with a space therebetween of about 30 nm or less.

12. A method, comprising:
forming a dummy gate material on a substrate having active regions and isolation regions;
patterning the dummy gate material to form a plurality of continuous dummy gate strips, spanning over the active regions and the isolation regions;
forming dielectric material about the continuous dummy gate strips;
forming a plurality of trenches in the dielectric material by removing the dummy gate strips;
forming continuous replacement gate structures within the plurality of trenches;
segmenting the continuous replacement gate structures to form a plurality of segmented replacement gates, with an end to end spacing between the plurality of segmented replacement gates; and
filling the end to end spacing with an insulator material.

13. The method of claim 12, wherein the dielectric material is planarized.

14. The method of claim 12, wherein the segmenting is provided by an etching process, after exposure steps for the plurality of segmented replacement gates.

15. The method of claim 12, wherein the end to end spacing is about 30 nm or less.

16. The method of claim 12, wherein the plurality of segmented replacement gates are formed by depositing one or more metal layers within the plurality of trenches.

17. The method of claim 16, wherein the plurality of segmented replacement gates are formed by depositing a high-k dielectric material under the one or more metal layers.

* * * * *